United States Patent [19]
Hennerici et al.

[11] Patent Number: 5,444,234
[45] Date of Patent: Aug. 22, 1995

[54] POSITION TRANSMITTER FOR ACQUIRING THE POSITION OF A LIGHT BEAM

[75] Inventors: Wolfgang Hennerici, Ingelheim; Gerhard Brunst; Enno Holzenkaempfer, both of Taunusstein, all of Germany

[73] Assignee: Heimann Optoelectronics GmbH, Wiesbaden, Germany

[21] Appl. No.: 312,083

[22] Filed: Sep. 26, 1994

[30] Foreign Application Priority Data

Sep. 27, 1993 [DE] Germany .................. 43 32 859.8

[51] Int. Cl.⁶ .................. G05D 3/12; H01L 27/14
[52] U.S. Cl. .................. 250/206.2; 250/208.2; 356/141.5
[58] Field of Search ............ 250/206.2, 206.1, 208.2, 250/208.3, 214.1, 203.1, 203.2, 203.3, 203.4, 203.6, 231.13, 231.14, 231.18, 370.1; 356/141.5, 141.2, 141.3, 139.01; 257/443, 457, 459, 465

[56] References Cited

U.S. PATENT DOCUMENTS

| | | | |
|---|---|---|---|
| 4,490,036 | 12/1984 | Anagnostopoulos | 356/1 |
| 4,766,307 | 8/1988 | Pelgrom et al. | 250/208.3 |
| 4,769,546 | 9/1988 | Kniffler et al. | 356/141.5 |
| 4,806,747 | 2/1989 | Dunavan et al. | 250/206.1 |
| 4,847,489 | 7/1989 | Dietrich | 250/226 |
| 4,857,721 | 8/1989 | Dunavan et al. | 250/206.1 |
| 5,130,775 | 7/1992 | Maeda et al. | 250/206.1 |
| 5,184,018 | 2/1993 | Conrads et al. | 250/370.09 |

FOREIGN PATENT DOCUMENTS

3540418 5/1987 Germany .
3939905 6/1991 Germany .

OTHER PUBLICATIONS

"Elektronische Kamera," Wellhauser, Elektronik Jan. 1991, pp. 60–64.

*Primary Examiner*—Edward P. Westin
*Assistant Examiner*—John R. Lee
*Attorney, Agent, or Firm*—Hill, Steadman & Simpson

[57] ABSTRACT

A position transmitter for acquiring the position of a light beam has at least one group of photodiodes arranged neighboring one another and fashioned strip-shaped such that at least two, typically 5–10, strip-shaped electrodes of a photodiode structure are at least partially covered by the light beam or particle beam whose position is to be acquired. An evaluation circuit measures the photocurrent or a correlated quantity of the individual strip electrodes and indicates the position of the beam on the basis of the distribution of the strengths of the photo currents.

16 Claims, 6 Drawing Sheets

| | Level | Output Bit/Antibit |
|---|---|---|
| Bit 1 | high | |
| Antibit 1 | low | |
| Bit 2 | low | |
| Antibit 2 | high | |
| Bit 3 | low | |
| Antibit 3 | high | |
| Bit 4 | high | |
| Antibit 4 | low | |

Example Bit/Antibit-Output Address "9" (low state)

Strip-electrode Number

POSITION TRANSMITTER FOR ACQUIRING THE POSITION OF A LIGHT BEAM

BACKGROUND OF THE INVENTION

1. Field of the Invention

The present invention is directed to a position transmitter (detector) for acquiring the position of a light beam. The term "light beam" is used herein in the broadest sense and refers to an electromagnetic emission beyond the visible range, or particles as well, cause the generation of a current from a transducer.

2. Description of the Prior Art

Position transmitters are known in the art composed of two electrodes each formed by a photodiode, the photodiodes being disposed perpendicularly to each other. Such detectors are employed whenever it is useful to monitor the variation of the relative positions the light beam and the position transmitter.

Thus, position transmitters are employed as goniometers (angle measuring units) when the light beam does not vary in position and the position transmitter is arranged, for example, on a cylindrical exterior surface of a rotating subject. Position transmitters also can be employed for the adjustment of an apparatus, whereby the transmitter itself is rigidly connected to one apparatus part and a reference light beam, for example a laser beam, that serves the purpose of adjustment is incident on the surface of the position transmitter.

Position transmitters are known that are essentially composed of a uniform, photosensitive detector surface and a signal read-out and evaluation circuit. Currents from the point of incidence of a light beam on the uniform detector surface to two edges of the detector surface that reside perpendicularly to one another are sampled with this circuit and the position of the point of incidence of the light beam on the detector is calculated therefrom. Inhomogeneities in the photosensitivity, or in the values of resistance of the detector surface, falsify the result of the position identification. Stray light or daylight incident onto the detector surface also falsify the result, since the currents are then not exclusively caused by the incidence of the light beam to be measured on the detector surface.

SUMMARY OF THE INVENTION

An object of the present invention is to present a position transmitter that, given higher precision, enables an absolute indication of position even given ambient light, whereby the detector surface can be manufactured extremely large and in an economical manner.

The above object is achieved in accordance with the principles of the present invention in a position sensor having two groups of electrodes, with the electrodes in each group being disposed parallel to each other, and the electrodes in the different groups being disposed perpendicularly relative to each other, wherein the electrodes are formed by a plurality, of strip-shaped photodiode structures, the photodiodes being arranged so that at least two, and typically 5-10 of the strip-shaped photodiodes will be at least partially covered by the incident light beam or particle beam. Each strip-shaped photodiode generates a photocurrent corresponding to the coverage of that strip-shaped photodiode by the incident light beam or particle beam. An evaluation circuit measures the respective photocurrents, or a quantities correlated therewith, and indicates the position of the incident light or particle beam by analyzing the distribution of the strengths of the respective photocurrents relative to the respective positions of the strip-shaped photodiodes.

According to the present invention, a position transmitter is composed of a large-area diode structure whose electrodes are preferably arranged strip-shaped. The dimensions of the strip-shaped electrodes are selected such that a typical light beam to be measured partially covers 5-10 strips. The parts of the light beam incident on the respective photodiodes are measured either directly via the photocurrent or via the voltage drop of the photocurrent across an external resistor or across an integrated resistor.

The strip electrodes can be arranged in two groups perpendicularly relative to one another in matrix form; they can also be arranged star-shaped and/or concentrically on a rigid glass or metal substrate or can also be arranged on a flexible foil.

The photodiodes can be Schottky diodes or PIN diodes, may be composed of amorphous or crystalline silicon, and can be applied on the substrate with photolithograpic methods.

The evaluation circuit can likewise be manufactured by integration in silicon thin-film technology and can include decoders or shift registers and thin-film transistors.

DESCRIPTION OF THE PREFERRED EMBODIMENTS

Figure 1A:
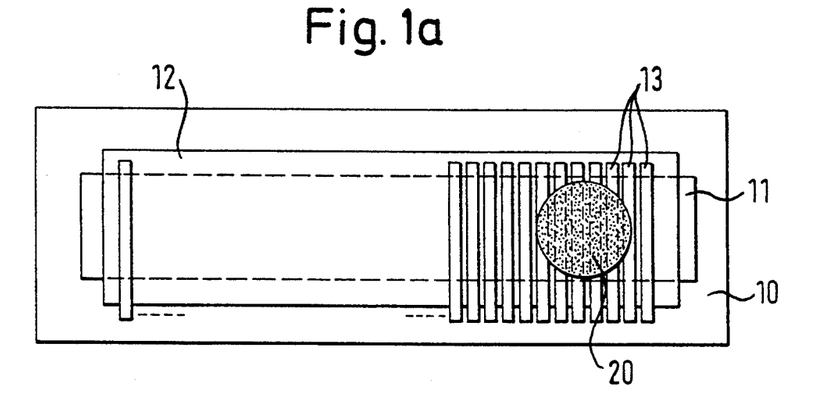
FIGS. 1a and 1b respectively show a first embodiment of a one-dimensional position transmitter of the invention in plan view and in side view.
Figure 1B:
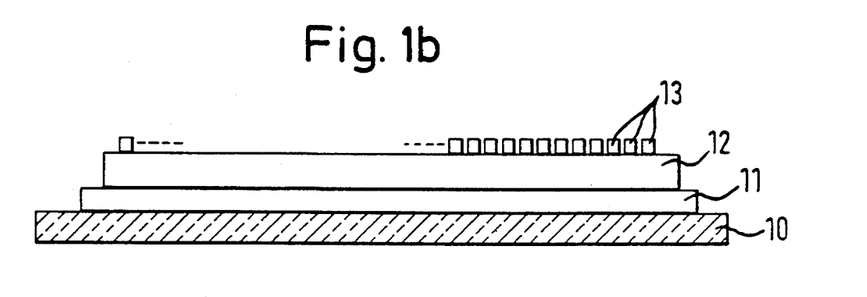
Figure 1C:
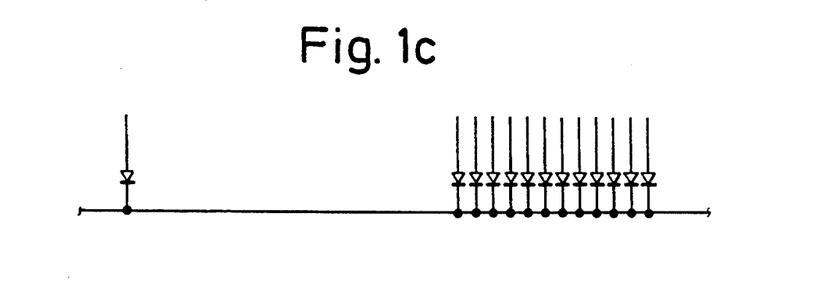
FIG 1c is a circuit diagram of the position transmitter of FIGS. 1a and 1b.
Figure 1D:
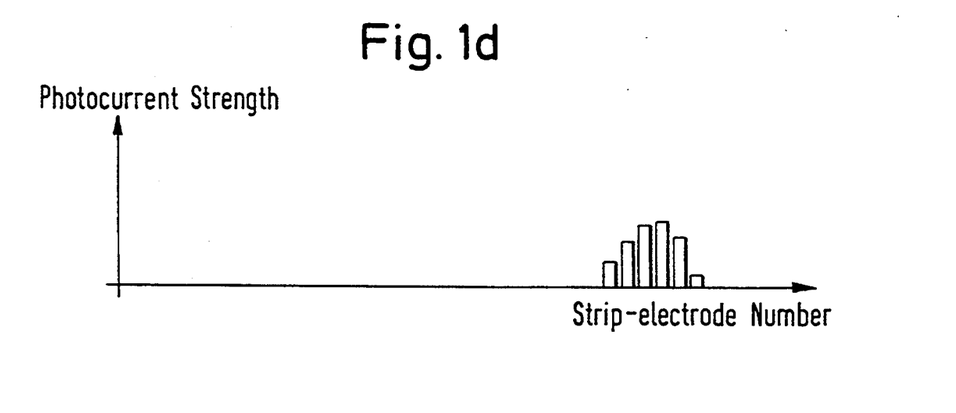
FIG. 1d shows a typical output signal of the position transmitter of FIGS 1a–1c.

FIG. 1a shows a position transmitter for the one-dimensional localization of a light spot 20. The light spot 20 partially covers six strip electrodes 13 that are arranged parallel to one another in close proximity to one another. A photoconductor 12 of, for example, amorphous silicon is located under the strip electrodes 13. The base electrode 11 that is applied on the substrate 10 is located under the photoconductor 12. FIG. 1b shows the arrangement in cross section. The strip electrodes 13 are fabricated of a TCO material (transparent conducting oxide), so that a part of the incident light can be transmitted onto the photoconductor 12. FIG. 1c schematically shows the combination of photodiodes that arises from the spatial arrangement according to FIGS. 1a and 1b. FIG. 1d shows the strength of the photocurrent measured at the at least partially illuminated strip electrodes 13. One can see that the distribution of the strength of the photocurrent is measured with the electrode structure, this enabling an exact position allocation of the light beam.

Such one-dimensional position transmitters are also suitable for identifying the angular position of rotating parts when the substrate is curved to conform to a cylindrical generated surface or a part of such a surface. As described below, it is not necessary to arrange the electrodes parallel to one another as straight strips; for example, rotationally symmetrical arrangements are also conceivable.

The diodes can be fashioned as Schottky diodes or as PIN diodes. A number of materials come into consideration as the substrate such as, for example, metal, ceramic or glass, whereby an illumination of the position transmitter through the substrate is also possible in the latter instance when the base electrode 11 is also manufactured of a transparent conducting oxide. Flexible substrates of, for example, plastic foil are likewise conceivable as long as the limitations in view of the electrical behavior given mechanical stresses of the foil coatings are taken into consideration.

Figure 2:
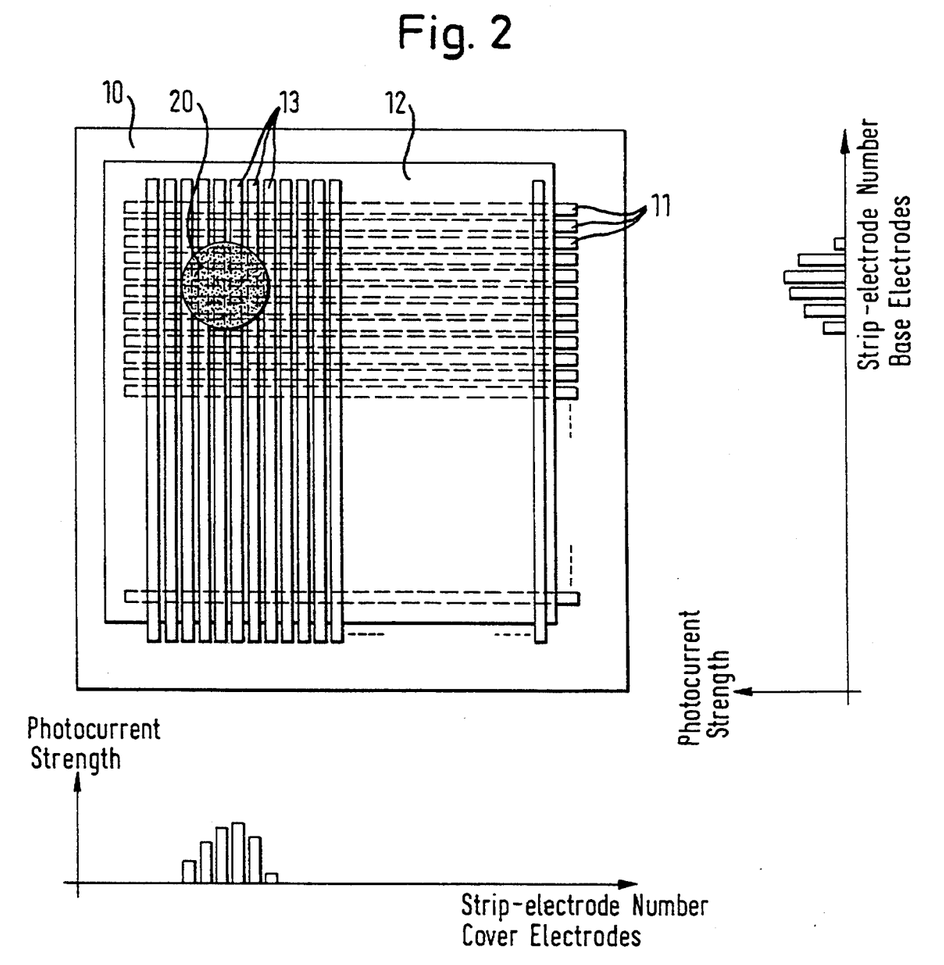
FIG. 2 shows a two-dimensional position transmitter of the invention in a matrix arrangement in plan view, with a representation of its output signals.

FIG. 2 shows a matrix arrangement of two layers of strip electrodes 11 (base electrodes) and 13 (cover electrodes) proceeding perpendicularly relative to one another and which are separated from one another and by a photoconductive layer 12. The projection of the light beam spot 20 in the x-direction and in the y-direction is thus obtained by the read-out of the photocurrents via the strip-shaped electrodes 13 and 11. The corresponding distributions of the strengths of the photocurrents are indicated at the bottom and at the right of FIG. 2.

Figure 3:
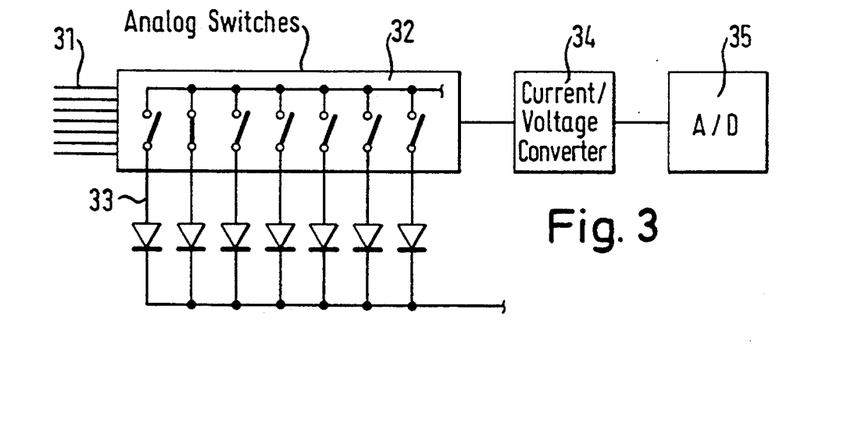
FIG. 3 is a more detailed circuit diagram of the position transmitter of the invention.

FIG. 3 shows a block circuit diagram of a one-dimensional position transmitter according to FIG. 1 together with drive and signal processing. An analog switch 32 serially conducts the signals of the strip electrodes 33 to a current/voltage converter 34 under the control of the address bus 31. The voltage signals are subsequently digitized by an analog-to-digital converter 35 and can be entered into a PC or into a microcontroller for the evaluation of the distribution of the strength of the photocurrents. Of course, parallel data processing is also possible when permitted by the number of strip electrodes present in the specific application. Correspondingly, a charge measurement with an integrator can ensue instead of the aforementioned current/voltage conversion.

Figure 4:
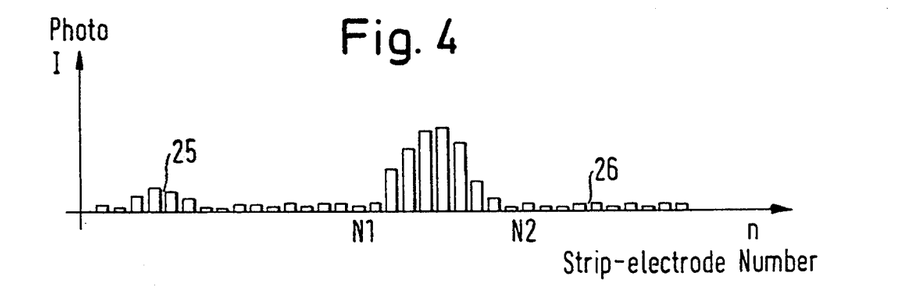
FIG. 4 illustrates the photocurrent with respect to the strip electrode number in the position transmitter of the invention, for an explanation of the suppression of noise signals.

For illustrating the evaluation method for the inventive position transmitter, FIG. 4 shows the strength of the photocurrent with respect to the strip electrode number in a one-dimensional electrode arrangement. Inventively, the appertaining strength of the photocurrent is measured for each strip electrode n. The measured distribution of the strengths of the photocurrents is allocated on the basis of a suitable parameter reduction to an unambiguous position that describes the distribution of the strengths of the currents. Centroid formation is recited as an example of such a function that describes the distribution. Noise 26 or unwanted signals 25 as well can be discriminated from the very outset in the identification of the centroid $n_{sp}$ $$n_{sp} = \frac{\sum_{n=N_1}^{N_2} I_n^{Photo} \cdot n}{\sum_{n=N_1}^{N_2} I_n^{Photo}}$$

so that these do not enter into the calculation of the centroid. The use of a threshold or other discrimination methods, for example, is suitable for this purpose. The centroid position $n_{sp}$ can then be calculated to a fraction of the width of a strip electrode. The strip electrode width, which can already be selected extremely small as a result of its manufacturing method (photolithography), thus does not represent a lower limit of the resolution in the identification of the position.

The possibility of taking only the environment of the distribution which is actually of interest into consideration makes the position transmitter of the invention attractive, especially for large-area detectors.

Figure 5:
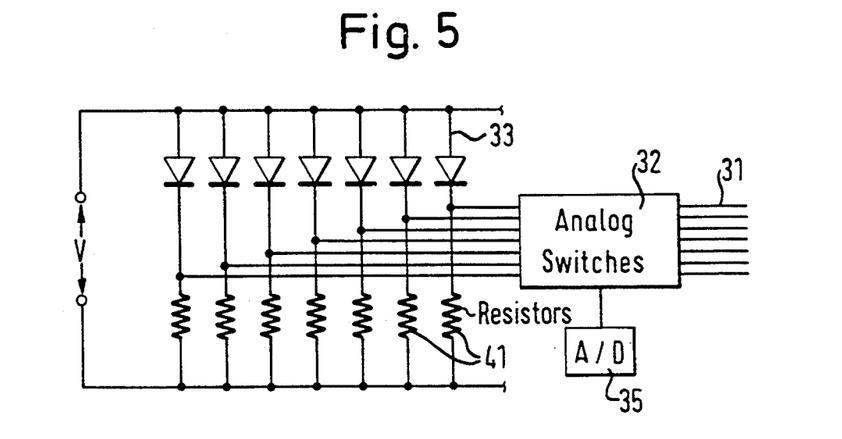
FIG. 5 is a circuit diagram of another embodiment of the present invention.

FIG. 5 shows a version of the position transmitter wherein the voltage drop produced by the photocurrent across a resistor 41 is measured instead of the photocurrent of the individual strip electrodes. This version is especially advantageous when the resistors can be manufactured integrated, i.e. they can be incorporated into the overall circuitry during the manufacture of the position transmitter. The resistors must be optimally (locally) uniform, since scatters in the values of resistance directly falsify the voltage signal to be measured.

Figure 6:
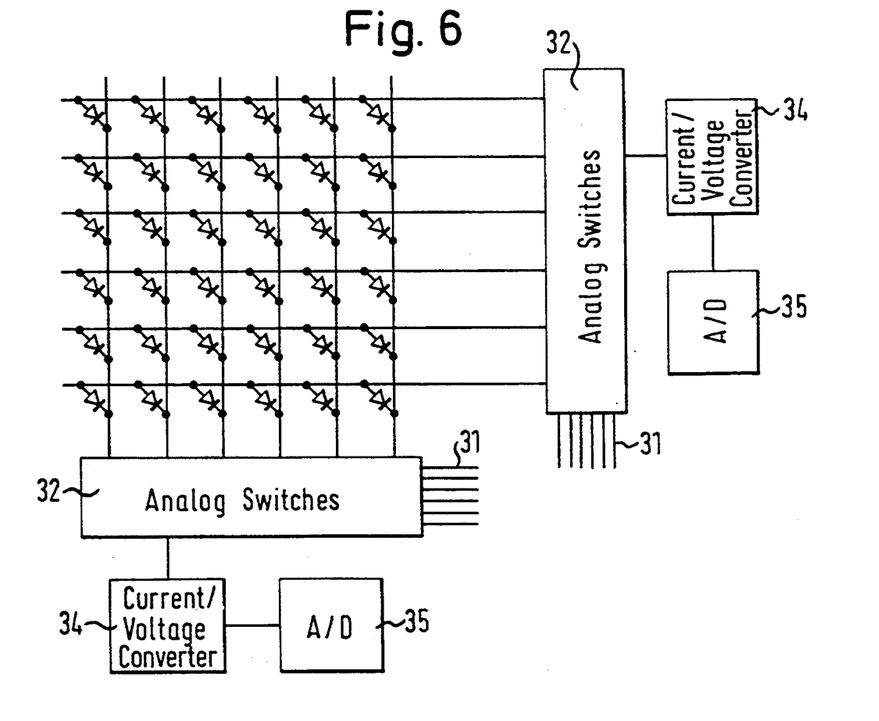
FIG. 6 is a circuit diagram of another embodiment of the present invention.

FIG. 6 shows a two-dimensional arrangement of the position transmitter of FIG. 3. The photocurrents of the electrodes arranged matrix-like are respectively through-connected via an analog switch 32. The addressing 31 for the base electrodes 11 and cover electrodes 13 which form the illustrated photodiodes can thereby ensue independently or in simplified synchronous fashion. Of course, the two-dimensional arrangement can also be realized with the voltage measurement according to FIG. 5.

Figure 7:
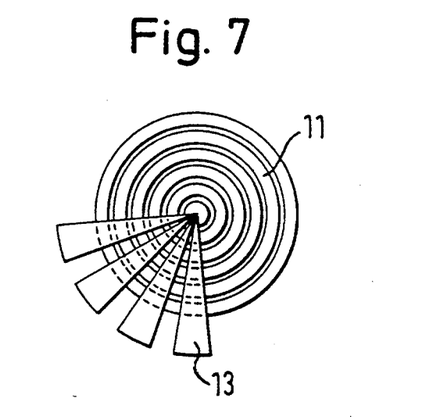
FIG. 7 shows a photodiode arrangement according to a further embodiment of the present invention.

As an example of a non-orthogonal arrangement, FIG. 7 shows a rotational-symmetrical position transmitter that directly supplies angle and radius information from output quantities. One strip electrode layer is thereby implemented as concentric circles 11 and the second electrode layer is implemented as a radial arrangement of electrodes 13. Angular position and radius are directly indicated as output quantities in this way.

Figure 8:
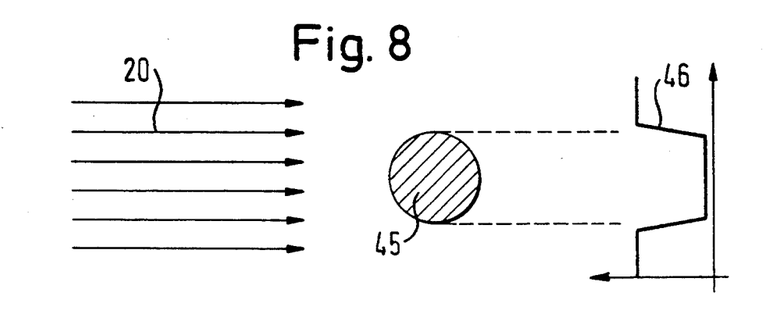
FIG. 8 illustrates the position measurement of a light shadow.

Shadow structures of a subject 45 can also be localized with the position transmitter of the invention, which is not possible with conventional position transmitters of the type initially described. To this end, the edges 46 of the distributions of the strength of the photocurrents are utilized, as shown in FIG. 8.

Figure 9:
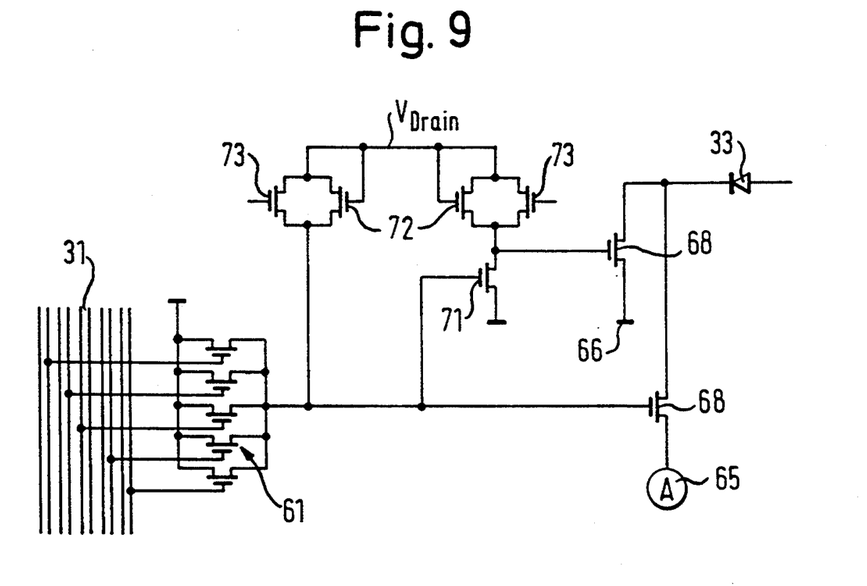
FIG. 9 is an integrated evaluation circuit for use in the position transmitter of the invention.

FIG. 9 shows the integrated execution of a diode structure, including the associated analog switches. This form of manufacture is especially useful given the execution of the position transmitter in amorphous silicon. A decoder circuit 61 of TFT (thin film transistor) elements through-connects a strip-electrode 33 via the switching transistor 68 for current measurement 65 only when the corresponding address is selected. The photocurrent of all non-addressed strip electrodes is conducted unmeasured to a location 66 lying at identical potential, so that no change in potential at the photodiode is caused by the measuring process. Since the switching frequencies that can be achieved with thin-film amorphous silicon transistors upon employment of amorphous silicon are clearly lower than, for instance, given crystalline components, an optimum drive and realization of the analog switches of amorphous silicon is necessary. An analog switch manufactured of thin-film amorphous silicon transistors that is suitable for high switching frequencies is described below.

The basic inverter circuit from which the analog switch is constructed is composed of a drive TFT 71 as well as a load TFT 72. In order to obtain the required signal levels, the geometrical dimension of the load TFT is selected clearly smaller than that of the drive TFT; typically, the ratio is at least 1:10. Due to the asymmetrical size relationship of the two TFTs, the dynamic switching behavior is also asymmetrical. The switching from high to low level, whereby the charge reversal is realized by the larger drive TFT 71, is fast compared to the switching from high to low level wherein the charge reversal is effected by the smaller load TFT 72. An increase in the obtainable switching frequency is achieved by arranging a further TFT 73, having dimensions that approximately corresponding to those of the drive TFT 71, parallel to the load TFT 72. This further TFT 73 is driven by an additional signal that is present for a significantly shorter time than the address signal. During this time, the charge reversal by the load TFT 72 can be left out of consideration, so that a symmetrical inverter structure is essentially present. When a low level is present present at the inverter input, the auxiliary TFT 73 switches to a somewhat reduced high level. Since the charge reversal event ensues significantly faster than on the basis of the load TFT 72, the auxiliary TFT 73 can already be shut off again after a short time. After this, the higher high level having the slower time constant caused by the load TFT 72 is established. Since it is only the reaching of a level, however, that is critical for the inverter behavior, a significantly higher clock rate can be achieved on the basis of this measure.

When a high level is present at the inverter input, then the reduced high level is again set upon switching of the auxiliary TFT 73. The low level is established only after the auxiliary TFT 73 is shut off. Overall, thus, the switching to low level is somewhat slowed due to the operation with the auxiliary TFT 73 (by somewhat less than the turn-on time of the auxiliary TFT 73). Since this switching event, however, is not time-defining, a significantly higher clock rate arises overall. An especially advantageous addressing method using thin-film amorphous silicon transistors is set forth below with reference to FIG. 10.

Figure 10:
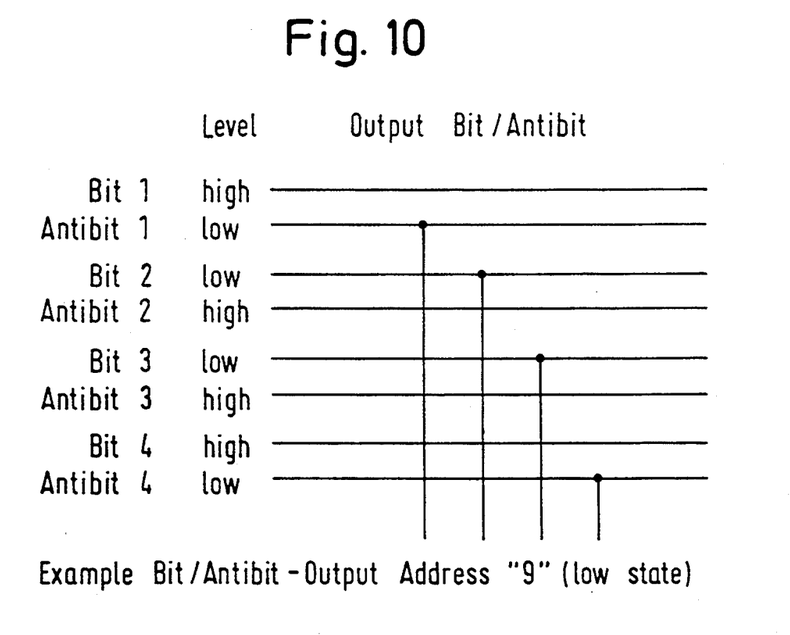
FIG. 10 illustrates an addressing method for use in the position transmitter.

The address of the strip electrode to be read out is binary coded by the preceding, crystalline electronics and is generated a second time as an "anti-address", i.e. as a complementary address having negated bit information. An address coding as shown in FIG. 10 results in all address coders (low-active) having realized by an identical, preceding inverter of TFTs. The discrimination between the various addresses is achieved by the respectively present bit/anti-bit selection. As a result, the switching time is minimized independently of the respective address. FIG. 10 shows an address coding with reference to the address example "9" with a 4-bit address.

A further advantage of this address coding shown in FIG. 10 is that the sum signal of individual regions or blocks of a position transmitter can be designationally (selectively) driven, so that a more flexible addressing becomes possible. When, for example, one particular channel is to be read out, then an unambiguous address is supplied to the address bus with the anti-bit information derived therefrom. When, however, the LSB and the associated anti-bit line are both set to low, then two analog switches are simultaneously switched (low state). At the second LSB, third LSB or, $n^{th}$ LSB, the same procedure respectively leads to 4, 8 or, $2^n$ analog switches that switch simultaneously. It is thereby possible to read the position transmitter completely out more rapidly in rougher steps by combining strip electrodes. One example of this, for instance, is a search sequence wherein the position transmitters to be scanned or wherein a region of the sensor having high resolution (i.e. channel-by-channel) and another region having coarser resolution by combining channels are to be examined. A search sequence, for example, can be executed in the following way. A distinction is first made between the right and the left sensor halves by switching the MSB. In the next step, the second MSB is correspondingly switched for the desired sensor half; all less-significant bits and anti-bits remain set to low (low state). This procedure is continued until the beam spot is localized. An integrated resistor can also be employed in this exemplary embodiment in order to directly generate a drop in potential as the measured signal. Of course, this read-out circuit manufactured integrated with the photodiode can also be realized using a single-crystal manufacturing method.

Figure 11:
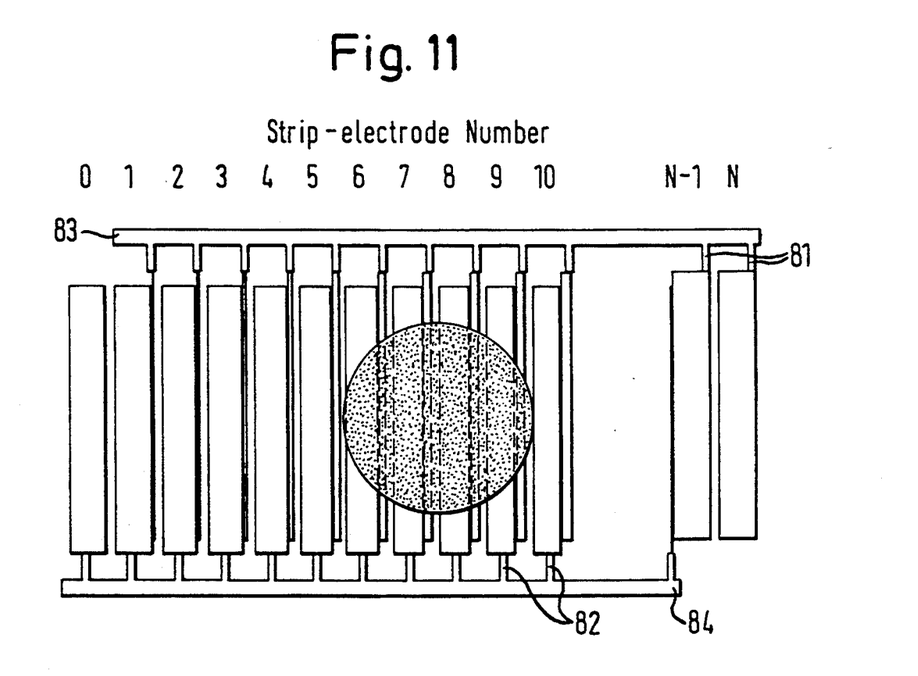
FIG. 11 shows a photodiode arrangement according to a further embodiment of the present invention.

FIG. 11 shows a further embodiment of the present invention with which a direct measurement of the centroid of a distribution of the photocurrent is possible without multiplexors. The embodiment shown in FIG. 11 is one-dimensionally designed for simplicity. Of course, this embodiment can be expanded to two dimensions analogously to the embodiment shown in FIG. 2.

The electrodes of each diode group are again divided into many strips, so that the profile of the distribution of the strengths of the photocurrents can be measured based on the knowledge of the number of strip electrodes and of the photocurrent of each and every strip. In this embodiment, however, the area relationships of the strip electrodes are additionally selected such that the product of the photocurrent times the strip electrode number required for the centroid identification can be directly measured. To this end, each electrode is subdivided into two electrode areas separated from one another, each of these having its own tap 81 or 82. All electrodes (and sub-electrodes) have the identical length. Each electrode is composed of a sub-electrode having a width or a surface that is proportional to the electrode number and another sub-electrode having a width or surface such that the sum of the surfaces of the two sub-electrodes is constant for all electrodes. The respective signals of those sub-electrodes whose surface increases proportionally relative to the electrode number are conducted to a collective contact (tap) 83. The other sub-electrodes are contacted in common to a contact (tap) 84. Consequently, a signal $$\frac{1}{N} \sum_n n \cdot I_n^{Photo} \quad (1)$$

is present at the contact 83,
whereby N denotes the total number of electrodes,
n: is the running parameter of the electrode numbering, and
$I^{Photo}$ indicates the strength of the photocurrent of the $n^{th}$ electrode.
The signal $$\frac{1}{N} \sum_n (N - n) I_n^{Photo} = I_{all}^{Photo} - \frac{1}{N} \sum_n n \cdot I_n^{Photo} \quad (2)$$

by contrast, is adjacent at the contact 84.
The expression $$I_{all}^{Photo} - \frac{2}{N} \sum_n n \cdot I_n^{Photo} \quad (3)$$

derived by subtraction of the two signals. The addition of the two signals yields the overall photocurrent.

Figure 12:
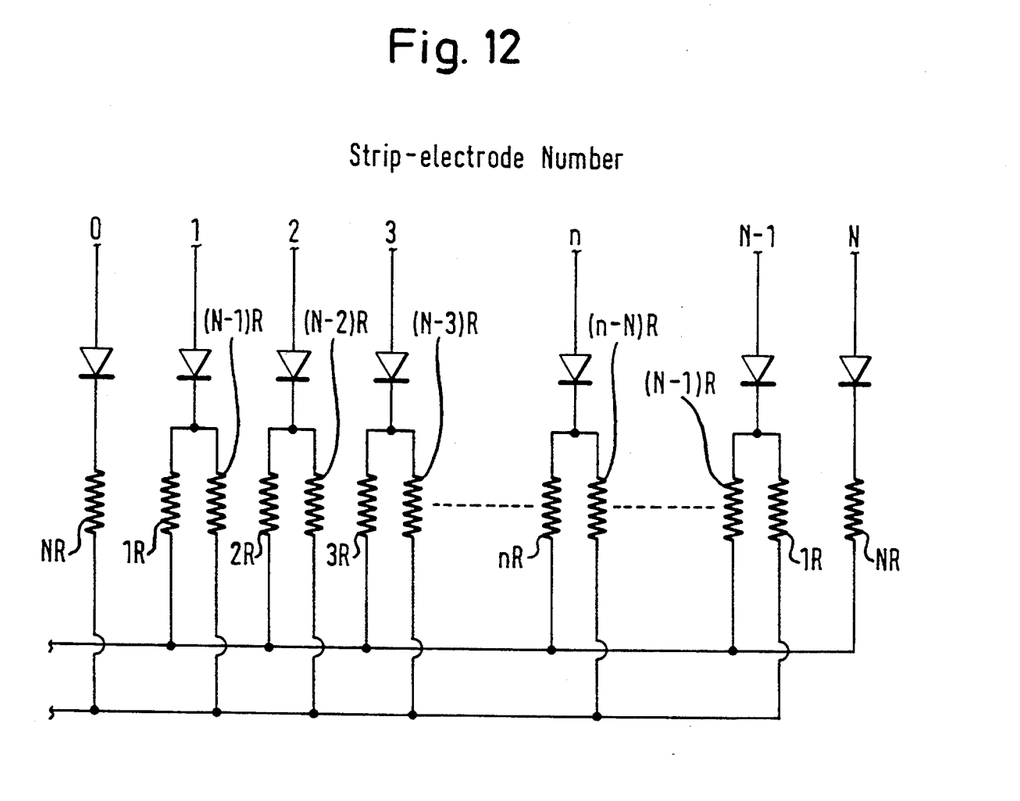
FIG. 12 shows a photodiode arrangement according to a further embodiment of the present invention.

Alternatively to the division of the strip electrode into two sub-electrodes having different widths, the same weighting of the photocurrent with the strip electrode number can be achieved by following resistors. Dependent on the strip electrode number, only a fraction of the photocurrent is forwarded for the measurement of the expression $$\frac{1}{N} \cdot n \cdot I_n^{Photo} \quad (4)$$

The remaining current is conducted via the parallel resistor for measuring the second expression $$\frac{1}{N} (N - n) I_n^{Photo} \quad (5)$$

so that the centroid of the distribution of the strengths of the photocurrents $$\frac{\sum_m n \cdot I_m^{Photo}}{\sum_m I_m^{Photo}} \quad (6)$$

can again be calculated, as in the above case. As a result of the direct measurement of the expressions (1) and (2) achieved due to the hard wiring, the position transmitters of FIG. 11 and of FIG. 12 are particularly suitable for fast position determinations. Since the centroid formation is additive, large-area position transmitters can be constructed by block formation (joining a plurality of independent structures). The centroid of the distribution of the strengths of the photocurrents is calculated by the following expression:

$$\frac{\sum_m (m + Sm) I_m^{Photo}}{\sum_m I_m^{Photo}} ; 0 \leq Sm \leq 1 \quad (7)$$

with
m = block number
Sm = centroid position within the block m
$I_m^{Photo}$ = overall strength of the photocurrent of the block m.

A matrix-like arrangement of two groups of strip electrodes enables the two-dimensional localization of a light spot with direct centroid identification.

Although modifications and changes may be suggested by those skilled in the art, it is the intention of the inventors to embody within the patent warranted hereon all changes and modifications as reasonably and properly come within the scope of their contribution to the art.

We claim as our invention:

1. A position transmitter for acquiring the position of an electromagnetic beam comprising:
   two groups of electrodes each composed of a plurality of strip-shaped photodiodes, the strip-shaped photodiodes in each group being parallel to the other strip-shaped photodiodes in that group, and the strip-shaped photodiodes in the two groups being perpendicular to each other, the strip-shaped photodiodes in each group being oriented so that at least two of the strip-shaped photodiodes in a group are at least partially covered by said beam, each strip-shaped photodiode generating a photocurrent corresponding to coverage of that strip-shaped photodiode by said beam; and
   evaluation means for measuring the respective photocurrents and for identifying a position of said beam with reference to the distribution of the strengths of said photocurrents relative to the positions of the strip-shaped photodiodes in the groups.

2. A position transmitter as claimed in claim 1 wherein each of said strip-shaped photodiodes have an identical width and are disposed parallel to an immediately proximity with each other.

3. A position transmitter as claimed in claim 1 wherein said strip-shaped photodiodes in one of said groups are arranged in the form of a plurality of concentric circles.

4. A position transmitter as claimed in claim 3 wherein said strip-shaped photodiodes in the other of said groups of electrodes are disposed radially proceeding from a center of said concentric circles.

5. A position transmitter as claimed in claim 1 wherein said strip-shaped photodiodes comprise amorphous silicon applied onto a substrate of material selected from the group consisting of rigid glass, ceramic and metal.

6. A position transmitter as claimed in claim 5 wherein said strip-shaped photodiodes comprise Schottky diodes.

7. A position transmitter as claimed in claim 5 wherein said strip-shaped photodiodes comprise PIN diodes.

8. A position transmitter as claimed in claim 1 wherein said strip-shaped photodiodes are photolithographically applied on foil material.

9. A position transmitter as claimed in claim 1 wherein said strip-shaped photodiodes comprise crystalline silicon photodiodes.

10. A position transmitter as claimed in claim 1 wherein said evaluation means comprises a plurality of resistors respectively allocated to said strip-shaped photodiodes, and means for measuring a voltage drop of said photocurrent across each resistor.

11. A position transmitter as claimed in claim 1 wherein said strip-shaped photodiodes comprise amorphous silicon photodiodes, and wherein said evaluation means comprise a plurality of integrated thin-film transistors respectively connected to said strip-shaped photodiodes and means for reading signals from said transistors.

12. A position transmitter as claimed in claim 11 wherein said means for reading operates at a switching frequency and includes a further thin-film transistor for increasing said switching frequency.

13. A position transmitter as claimed in claim 11 wherein said thin-film transistors are identically constructed, and wherein said means for reading includes means for addressing said thin-film transistors with a pair of address signals composed of a binary coded address and a negated address complementary to said binary coded address.

14. A position transmitter as claimed in claim 1 wherein said evaluation means includes means for employing a curve matching method for identifying said position of said radiation beam by said distribution of the strengths of said photocurrents.

15. A position transmitter as claimed in claim 1 wherein each strip-shaped photodiode comprises first and second regions separated along a direction perpendicular to their width, said first region having a width corresponding to a number of said strip-shaped photodiode within its group with said width increasing according to said number, and the other region in each electrode having a width so that a combined width of said first and second regions is the same for each strip-shaped photodiode; and said evaluation means including a first contact electrically connected to each of said first regions and a second contact connected to each of said second regions, and means for calculating a sum of said photocurrents weighted by the number of the strip-shaped photodiode within the group and for identifying a centroid of said distribution of the strengths of said photocurrents from a difference between signals at said first contact and said second contact.

16. A position transmitter as claimed in claim 1 wherein each strip-shaped photodiode comprises first and second regions separated along a direction perpendicular to their resistance, said first region having a resistance corresponding to a number of said strip-shaped photodiode within its group with said resistance increasing according to said number, and the other region in each electrode having a resistance so that a combined resistance of said first and second regions is the same for each strip-shaped photodiode; and said evaluation means including a first contact electrically connected to each of said first regions and a second contact connected to each of said second regions, and means for calculating a sum of said photocurrents weighted by the number of the strip-shaped photodiode within the group and for identifying a centroid of said distribution of the strengths of said photocurrents from a difference between signals at said first contact and said second contact.

* * * * *